(12) United States Patent
Shim

(10) Patent No.: US 8,284,615 B2
(45) Date of Patent: Oct. 9, 2012

(54) REFRESH CONTROL CIRCUIT AND METHOD FOR SEMICONDUCTOR MEMORY DEVICE

(75) Inventor: Young-Bo Shim, Gyeonggi-do (KR)

(73) Assignee: Hynix Semiconductor Inc., Gyeongg-do (KR)

( * ) Notice: Subject to any disclaimer, the term of this patent is extended or adjusted under 35 U.S.C. 154(b) by 69 days.

(21) Appl. No.: 12/979,678

(22) Filed: Dec. 28, 2010

(65) Prior Publication Data
US 2012/0163111 A1   Jun. 28, 2012

(51) Int. Cl.
*G11C 11/34* (2006.01)
(52) U.S. Cl. .......... 365/185.25; 365/222; 365/191; 365/233.14
(58) Field of Classification Search ........ 365/185.25, 365/222, 191, 133.14
See application file for complete search history.

(56) References Cited

U.S. PATENT DOCUMENTS
2003/0185079 A1*  10/2003  Takatsuka et al. ........... 365/222
* cited by examiner

*Primary Examiner* — Jason Lappas
(74) *Attorney, Agent, or Firm* — IP & T Group LLP

(57) ABSTRACT

A refresh control circuit for a semiconductor memory device includes a refresh controller configured to control the number of times a refresh signal is enabled during one refresh period in response to a refresh mode entering signal which indicates the start of a refresh mode, and a mode determination signal having refresh mode information, a refresh counter configured to output a row address for a refresh operation by counting the refresh signal in response to an active signal enabled in an active mode, and a row address decoder configured to decode the row address to generate a row address selection signal for sequentially accessing word lines within a cell array.

18 Claims, 7 Drawing Sheets

REFRESH CONTROL CIRCUIT AND METHOD FOR SEMICONDUCTOR MEMORY DEVICE

BACKGROUND OF THE INVENTION

Exemplary embodiments of the present invention relate to a semiconductor memory device, and more particularly, to a refresh control circuit and method for a semiconductor memory device.

A memory device, for example, a Dynamic Random Access Memory (DRAM) device, includes a plurality unit cells each of which has one transistor and one capacitor, and data is preliminarily stored in the capacitor. However, since a capacitor formed over a semiconductor substrate is not completely electrically disconnected from its surroundings in a memory device, the data stored in the capacitor may be discharged, and thus, the data may not be retained. In short, leakage current occurs and data of a memory cell may be damaged. To address the problem, the memory device periodically performs a refresh operation to retain the charge which was stored in the capacitor.

A memory device having a refresh operation mode performs a refresh operation while sequentially varying the internal address based on an external command. In other words, when the memory device enters the refresh operation mode based on an external command, a word line of a memory cell is selected according to a row address, which sequentially increases at a predetermined period. The charge stored in the capacitor corresponding to the selected word line is amplified by a sense amplifier and then stored again in the capacitor. Through a series of refresh processes, the stored data is retained without being damaged.

The refresh operation is largely divided into a self-refresh operation and an auto refresh operation. According to the self-refresh operation, an external controller sends a refresh initialization signal and a device performs a refresh operation until the device receives a refresh termination signal. According to the auto refresh operation, an external controller sends a refresh command during a normal operation and a device performs a refresh operation accordingly. Herein, both the self-refresh operation and the auto refresh operation are performed as an internal counter generates an address after the device receives a command and the address sequentially increases whenever the device receives a request.

According to the self-refresh operation, the refresh operation is performed periodically according to a period decided internally. Herein, a period of recharging a capacitor is referred to as a refresh period and it is decided based on a condensing capacity and extermination time of a cell.

According to the auto refresh operation, where a semiconductor device has a refresh cycle of approximately 4 k/64 ms, a counter sequentially refreshes all cells internally when 4096 auto refresh commands are received within 64 milliseconds (ms).

FIG. 1 is a block diagram illustrating a conventional semiconductor memory device for controlling an auto refresh operation.

As shown in the drawing, the conventional semiconductor memory device 100 for controlling a refresh operation includes a command generator 110, a refresh counter 120, a row address decoder 130, and a cell array 140.

The command generator 110 decodes external commands CSB, RASB, CASB and WEB inputted from the outside of the semiconductor memory device in response to a clock CLK to generate internal commands REF and ACT. Herein, the external command "CSB" denotes a chip selection signal, and the external command "RASB" denotes a row address strobe signal. The external command "CASB" denotes a column address strobe signal, and the external command "WEB" denotes a write enable signal. Also, the internal command "REF" denotes a refresh signal, and the internal command "ACT" denotes an active signal.

The refresh counter 120 counts the refresh signal REF in response to the active signal ACT outputted from the command generator 110, and outputs a refresh address RA<0:N> so that all the word lines in the cell array 140 are sequentially accessed.

The row address decoder 130 decodes the refresh address RA<0:N>, generated in the refresh counter 120 during a refresh operation mode, and generates a row address selection signal BX_ADD for selecting a row address to perform a refresh operation.

The cell array 140 retains a stored charge by performing a refresh operation based on the row address selection signal BX_ADD, and thus, prevents data from being lost.

Hereafter, a conventional method for controlling a refresh operation of a semiconductor memory device is described with reference to FIG. 1.

First, the command generator 110 enables the active signal ACTMD after entering an active mode. Herein, the auto refresh counter 120 counts the refresh signal REF in response to the active signal ACT, outputted from the command generator 110, and outputs the refresh address RA<0:N>. The row address decoder 130 decodes the refresh address RA<0:N>, outputted from the auto refresh counter 120, and generates the row address selection signal BX_ADD for selecting a row address to perform a refresh operation. Therefore, the cell array 140 retains the stored charge by performing the refresh operation in response to the row address selection signal BX_ADD and prevents the data from being lost. Herein, the refresh operation is performed for one refresh row cycle time tRFC.

The method for performing an auto refresh operation based on an external command, which is described above, may not only apply a predetermined retention time to all cells constantly, but may also vary the amount of generated noise by changing the sequence refresh addresses. Therefore, it is useful for cell screening.

However, the conventional auto refresh operation is performed at a period determined based on an average retention time determined under the assumption that all cells have the same retention characteristic. Therefore, although a cell which does not have sufficient retention time needs to perform the refresh operation at a shorter refresh period than the determined period, the conventional refresh method performs the refresh operation according to the period determined based on the average retention time, and thus, data are lost.

SUMMARY OF THE INVENTION

An exemplary embodiment of the present invention is directed to a refresh control circuit and method for a semiconductor memory device that may reduce the influence of PVT variation by performing a refresh operation twice during one refresh row cycle time tRFC to decrease the size of an absolute delay duration.

Another exemplary embodiment of the present invention is directed to a refresh control circuit and method for a semiconductor memory device that may reinforce cells of short retention capacity to increase productivity by internally performing a refresh operation at a rate of 4K/32 ms although the auto refresh operation is performed according to an external command inputted from the outside at a rate of 8K/64 ms.

Yet another exemplary embodiment of the present invention is directed to a refresh control circuit and method for a semiconductor memory device that may reduce peak current required for a refresh operation while not increasing the refresh cycle time.

In accordance with an exemplary embodiment of the present invention, a refresh control circuit for a semiconductor memory device includes a refresh controller configured to control the number of times a refresh signal is enabled during one refresh period in response to a refresh mode entering signal which indicates the start of a refresh mode and a mode determination signal having refresh mode information, a refresh counter configured to output a row address for a refresh operation by counting the refresh signal in response to an active signal enabled in an active mode, and a row address decoder configured to decode the row address to generate a row address selection signal for sequentially accessing word lines within a cell array.

In accordance with another exemplary embodiment of the present invention, a method for controlling a refresh operation of a semiconductor memory device includes determining the number of times a refresh signal is enabled during one refresh period in response to a refresh mode entering signal which indicates the start of a refresh mode, and a mode determination signal having refresh mode information, outputting a row address for a refresh operation by counting the refresh signal in response to an active signal enabled in an active mode, and generating a row address selection signal for sequentially accessing word lines within a cell array by decoding the row address.

DESCRIPTION OF SPECIFIC EMBODIMENTS

Figure 1:
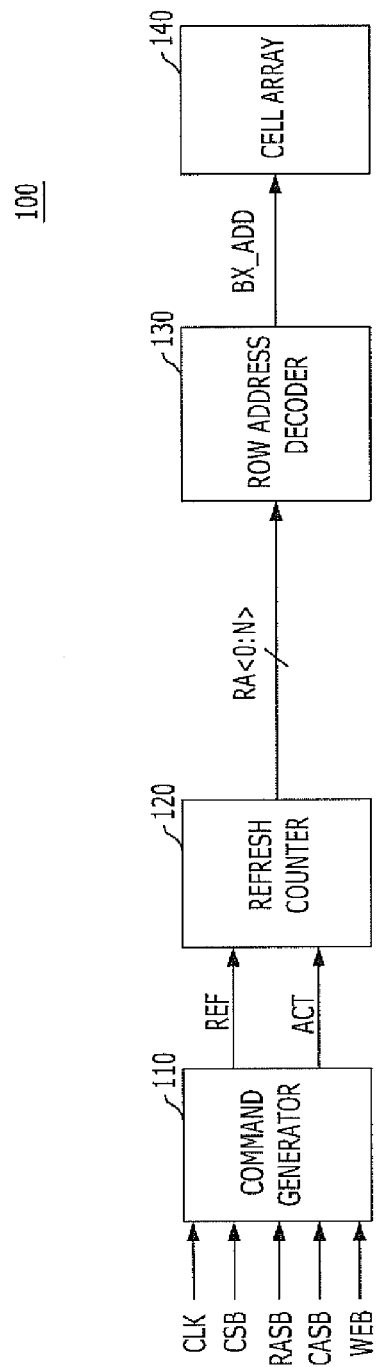
FIG. 1 is a block diagram illustrating a conventional semiconductor memory device for controlling an auto refresh operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
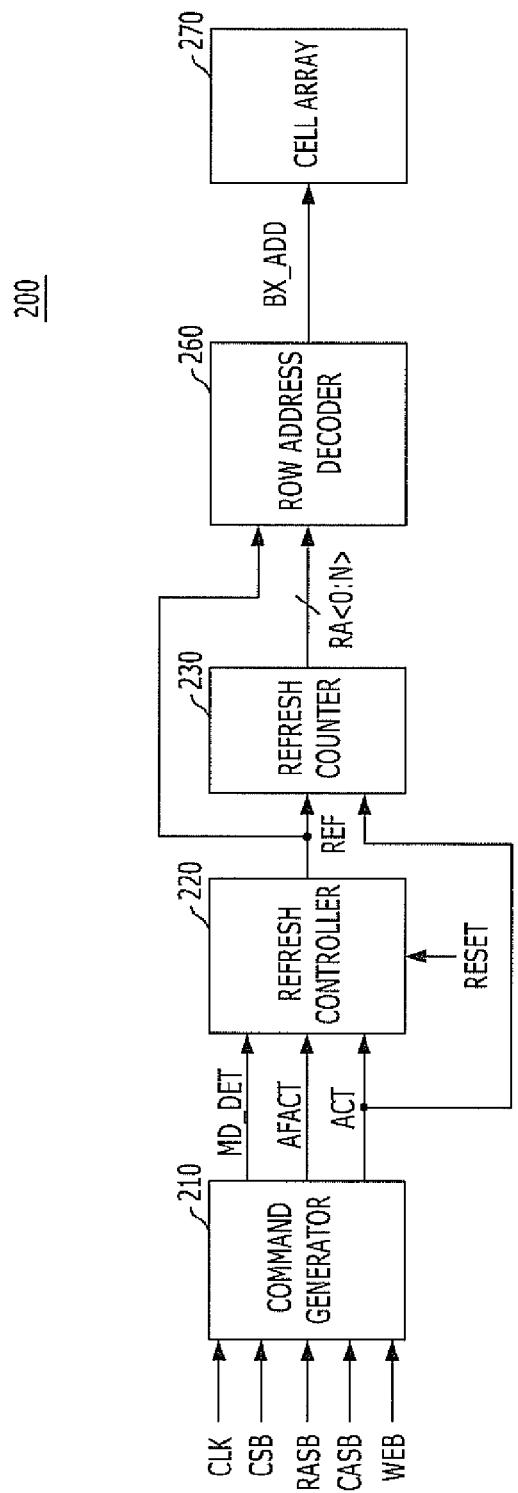
FIG. 2 is a block diagram illustrating a semiconductor memory device for controlling a refresh operation in accordance with an exemplary embodiment of the present invention.

FIG. 2 is a block diagram illustrating a semiconductor memory device for controlling a refresh operation in accordance with an exemplary embodiment of the present invention.

As shown in the drawing, the semiconductor memory device 200 for controlling a refresh operation includes a command generator 210, a refresh controller 220, a refresh counter 230, a row address decoder 260, and a cell array 270.

The command generator 210 decodes external commands CSB, RASB, CASB and WEB inputted from the outside of the semiconductor memory device in response to a clock CLK to generate internal commands MD_DET, ACT and AFACT.

Herein, the external command "CSB" denotes a memory semiconductor chip selection signal, and the external command "RASB" denotes a row address strobe signal. The external command "RASB" serves as a chip enable signal, which initiates the operation of a DRAM device. The external command "CASB" denotes a column address strobe signal and the external command "CASB" indicates that a column address is applied to the DRAM device. The external command "WEB" denotes a write enable signal and decides whether to write or read data into or from the DRAM device.

Also, among the internal commands, the internal command "ACT" denotes an active signal. The internal command "AFACT" denotes a refresh mode entering signal. The internal command "MD_DET" denotes a mode determination signal. The active signal ACT is a signal enabled when a semiconductor memory device is in an active mode. The refresh mode entering signal AFACT is a signal enabled when the semiconductor memory device enters a refresh mode. The mode determination signal MD_DET is disabled during a normal refresh mode, but enabled when the semiconductor memory device enters a double refresh mode.

The refresh controller 220 enables a refresh signal REF in order to perform a primary refresh operation. The refresh signal REF is enabled in response to the refresh mode entering signal AFACT, which is outputted from the command generator 210. Also, the refresh controller 220 senses the termination moment of the primary refresh operation, and enables the refresh signal REF again in order to perform a secondary refresh operation, when the mode determination signal MD_DET, outputted from the command generator 210, is enabled.

The refresh counter 230 counts the refresh signal REF in response to the active signal ACT, outputted from the command generator 210, and outputs a refresh address RA<0:N> so that all word lines in the cell array 270 may be sequentially accessed.

The row address decoder 260 generates a row address selection signal BX_ADD by decoding the refresh address RA<0:N> outputted from the refresh counter 230.

The cell array 270 retains a stored charge by performing a refresh operation based on the row address selection signal BX_ADD, and thus, prevents data from being lost.

The semiconductor memory device according to an exemplary embodiment of the present invention enables the refresh signal REF and performs a refresh operation when the refresh mode entering signal AFACT is enabled and the entering into a refresh mode is indicated.

Herein, in a case of a normal refresh mode, where the mode determination signal MD_DET is disabled, a refresh operation is performed once in the normal refresh mode. On the other hand, when the mode determination signal MD_DET is enabled and the semiconductor memory device enters a double refresh mode, a primary refresh operation is performed and then after sensing the termination of the primary refresh operation, the refresh signal REF is enabled again to perform a secondary refresh operation.

As described above, the semiconductor memory device features performing the primary refresh operation and the secondary refresh operation with a predetermined interval between them when the semiconductor memory device enters a double refresh mode. Herein, the primary refresh operation and the secondary refresh operation are performed during one auto refresh row cycle time tRFC. For example, when the auto refresh row cycle time tRFC of an auto refresh operation, which is performed in response to an external command inputted from the outside, is 7.8 μs, the auto refresh row cycle time tRFC of an auto refresh operation performed internally is half of 7.8 μs, which is 3.9 μs.

Therefore, the influence of PVT variation is minimized by performing a refresh operation twice during one auto refresh row cycle time tRFC to reduce the size of an absolute delay, and productivity may be increased by reinforcing the cells having a relatively short retention capability.

Figure 3:
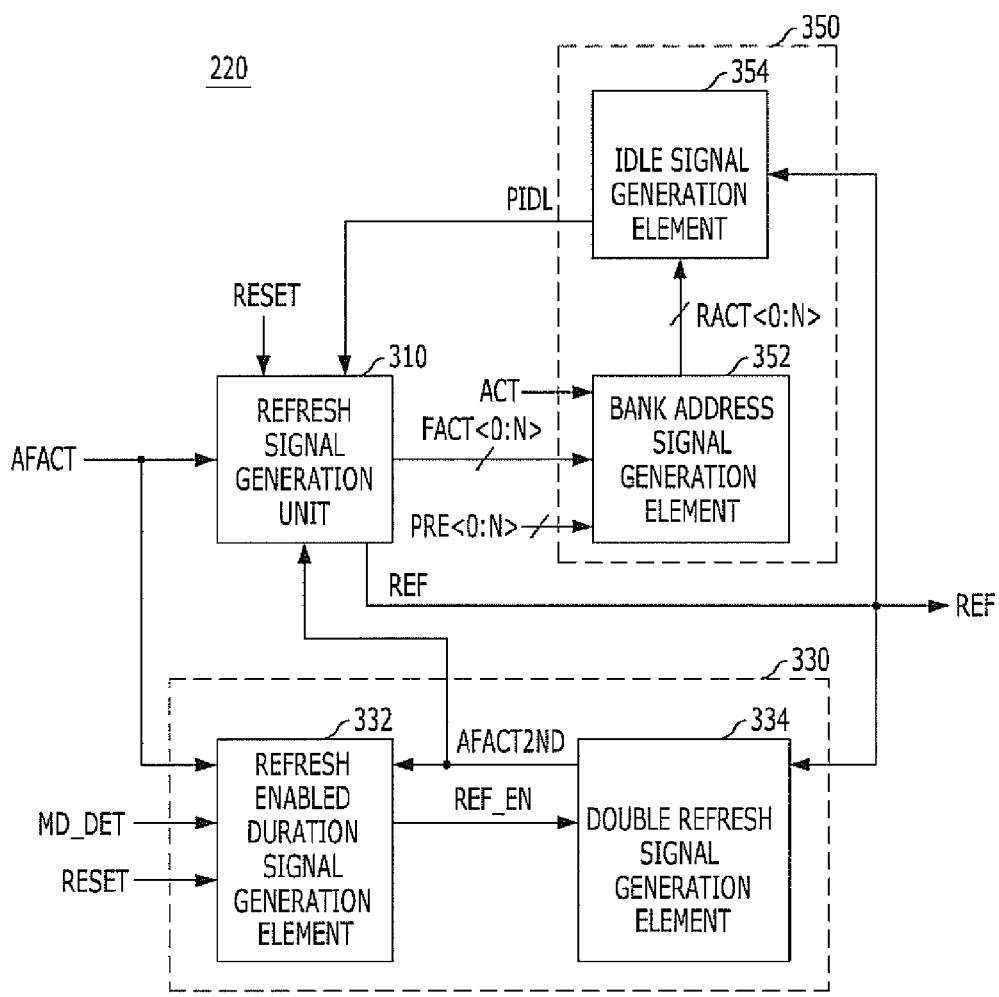
FIG. 3 is a block diagram of a refresh controller shown in FIG. 2.

FIG. 3 is an internal block diagram of the refresh controller 220 shown in FIG. 2.

Referring to FIG. 3, the refresh controller 220 includes a refresh signal generation unit 310, a double refresh operation control unit 330, and a refresh termination sensing unit 350.

The refresh signal generation unit 310 enables the refresh signal REF when at least one of the refresh mode entering signal AFACT and a double refresh signal AFACT2ND is enabled, and disables the refresh signal REF in response to an enabled idle signal PIDL by sensing a refresh operation termination moment. Also, the refresh signal generation unit 310 sequentially enables and outputs the respective signals of an active pulse signal FACT<0:7> with a predetermined delay time, when the refresh signal REF is enabled. Herein, the signals of the active pulse signal FACT<0:7> are signals for enabling corresponding banks, respectively. The refresh signal generation unit 310 initializes the refresh signal REF in response to a reset signal RESET.

The double refresh operation control unit 330 determines whether to enable the double refresh signal AFACT2ND based on the mode determination signal MD_DET, when the refresh mode entering signal AFACT is enabled.

To be specific, the double refresh operation control unit 330 includes a refresh enabled duration generation element 332 and a double refresh signal generation element 334. The refresh enabled duration generation element 332 enables a refresh enabled duration signal REF_EN based on the mode determination signal MD_DET when the refresh mode entering signal AFACT is enabled, and disables the refresh enabled duration signal REF_EN based on the double refresh signal AFACT2ND. Also, the refresh enabled duration generation element 332 initializes the refresh enabled duration signal REF_EN in response to the reset signal RESET.

The double refresh signal generation element 334 enables the double refresh signal AFACT2ND in response to the refresh enabled duration signal REF_EN and the refresh signal REF. To be specific, the double refresh signal generation element 334 senses the disabling of the refresh signal REF and enables the double refresh signal AFACT2ND at a pre-determined interval while the refresh enabled duration signal REF_EN is enabled.

The refresh termination sensing unit 350 receives the active pulse signal FACT<0:7> and outputs the idle signal PIDL that is enabled upon the termination of the refresh operation in the active mode where the active signal ACT is enabled.

To be specific, the refresh termination sensing unit 350 includes a bank address signal generation element 352 and an idle signal generation element 354.

The bank address signal generation element 352 generates a bank address RACT<0:7> in the active mode where the active signal ACT is enabled. The bank address RACT<0:7> is enabled in response to the enabling of the active pulse signal FACT<0:7> and disabled in response to the enabling of a pre-charge pulse signal PRE<0:7>. Herein, the signals of the pre-charge pulse signal PRE<0:7> are signals for enabling corresponding banks, respectively.

The idle signal generation element 354 senses a moment when the last address signal of the bank address RACT<0:7> turns from enabling to disabling and enables the idle signal PIDL during the refresh operation when the refresh signal REF is enabled.

Figure 4:
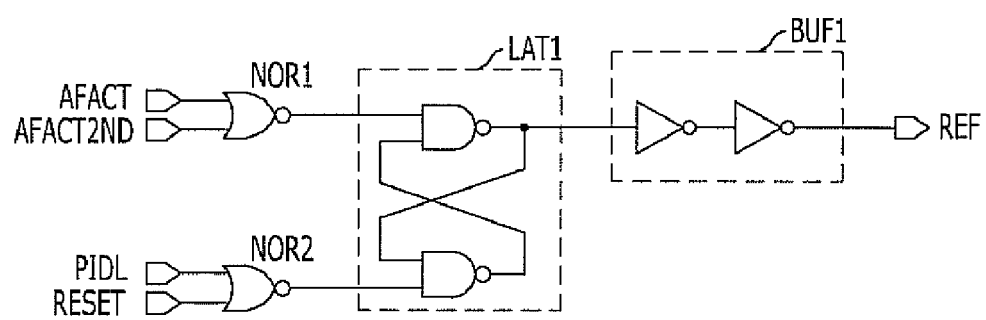
FIG. 4 is a circuit diagram of a refresh signal generator shown in FIG. 3.

FIG. 4 is a circuit diagram of the refresh signal generator 310 shown in FIG. 3.

Referring to FIG. 4, the refresh signal generator 310 includes a first NOR gate NOR1, a second NOR gate NOR2, a first latch LAT1, and a first buffer BUF1. The first NOR gate NOR1 performs a logic operation onto the refresh mode entering signal AFACT and the double refresh signal AFACT2ND and outputs the logic operation result. The second NOR gate NOR2 performs a logic operation onto the idle signal PIDL and the reset signal RESET and outputs the logic operation result. The first latch LAT1 latches and outputs the output of the first NOR gate NOR1 and the output of the second NOR gate NOR2. The first buffer BUF1 buffers the output of the first latch LAT1 and outputs it as a refresh signal REF. The first buffer BUF1 may include an even number of inverters.

To be specific, the first latch LAT1 may be an RS latch configured with NAND gates. In this case, when the output of the first NOR gate NOR1 is of a logic low level and the output of the second NOR gate NOR2 is of a logic high level, that is, when at least one between the refresh mode entering signal AFACT and the double refresh signal AFACT2ND is enabled to a logic high level, and both of the idle signal PIDL and the refresh signal REF are disabled to a logic low level, the first latch LAT1 outputs a signal of a logic high level. On the other hand, when the output of the first NOR gate NOR1 is of a logic high level and the output of the second NOR gate NOR2 is of a logic low level, that is, when both of the refresh mode entering signal AFACT and the double refresh signal AFACT2ND are of a logic low level, and at least one between the idle signal PIDL and the refresh signal REF are enabled to a logic high level, the first latch LAT1 outputs a signal of a logic low level. Also, when the outputs of the first NOR gate NOR1 and the second NOR gate NOR2 are both of a logic high level, that is, when the refresh mode entering signal AFACT, the double refresh signal AFACT2ND, the idle signal PIDL, and the refresh signal REF are all of a logic low level, the previous state is maintained.

The refresh signal generator 310, which is described above, enables the refresh signal REF when at least one between the refresh mode entering signal AFACT and the double refresh signal AFACT2ND is enabled, and disables the refresh signal REF when the idle signal PIDL is enabled. In this way, the refresh signal generation unit 310 sustains a duration when the refresh signal REF is enabled for a predetermined time. Herein, the duration where the refresh signal REF is enabled corresponds to a time when all banks are refreshed during an active mode.

Although not illustrated in the drawing, the refresh signal generation unit 310 sequentially enables the active pulse signal FACT<0:7> to have an additional circuit for outputting the enabled signals in the form of a pulse, when the refresh signal REF is enabled.

Figure 5:
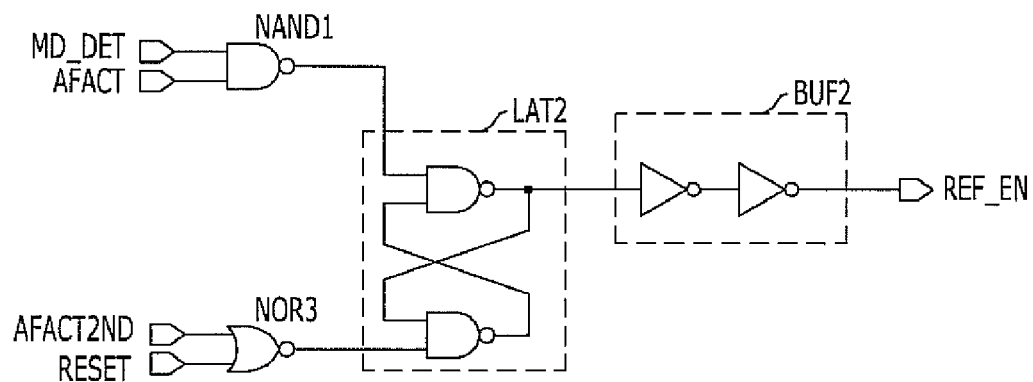
FIG. 5 is a circuit diagram of a refresh enabled duration signal generation unit shown in FIG. 3.

FIG. 5 is a circuit diagram of the refresh enabled duration signal generation unit 332 shown in FIG. 3.

Referring to FIG. 5, the refresh enabled duration generation element 332 includes a first NAND gate NAND1, a third NOR gate NOR3, a second latch LAT2, and a second buffer BUF2. The first NAND gate NAND1 performs a logic operation onto the mode determination signal MD_DET and the refresh mode entering signal AFACT. The third NOR gate NOR3 performs a logic operation onto the double refresh signal AFACT2ND and the reset signal RESET. The second latch LAT2 latches and outputs the outputs of the first NAND gate NAND1 of the third NOR gate NOR3. The second buffer BUF2 buffers the output of the second latch LAT2 and outputs it as a refresh enabled duration signal REF_EN. The second buffer BUF2 may be formed of an even number of inverters.

The second latch LAT2 may be an RS latch configured with NAND gates. In this case, when the output of the first NAND gate NAND1 is of a logic low level and the output of the third NOR gate NOR3 is of a logic high level, that is, when both of the mode determination signal MD_DET and the refresh mode entering signal AFACT are enabled to a logic high level, and both of the double refresh signal AFACT2ND and the reset signal RESET are disabled to a logic low level, the second latch LAT2 outputs a signal of a logic high level. On the other hand, when the output of the first NAND gate NAND1 is of a logic high level and the output of the third NOR gate NOR3 is of a logic low level, that is, when at least one of the mode determination signal MD_DET and the refresh mode entering signal AFACT are of a logic low level, and at least one of the double refresh signal AFACT2ND and the reset signal RESET is enabled to a logic high level, the second latch LAT2 outputs a signal of a logic low level. Also, when both of the outputs of the first NAND gate NAND1 and the third NOR gate NOR3 are of a logic high level, the previous state is maintained.

As described above, the refresh enabled duration generation element 332 enables the refresh enabled duration signal REF_EN when both the mode determination signal MD_DET and the refresh mode entering signal AFACT are enabled, and disables the refresh enabled duration signal REF_EN when the double refresh signal AFACT2ND is enabled.

Therefore, the refresh enabled duration signal REF_EN has an operation duration that it is enabled at a moment when the primary refresh operation starts and disabled at a moment when the secondary refresh operation starts.

Figure 6:
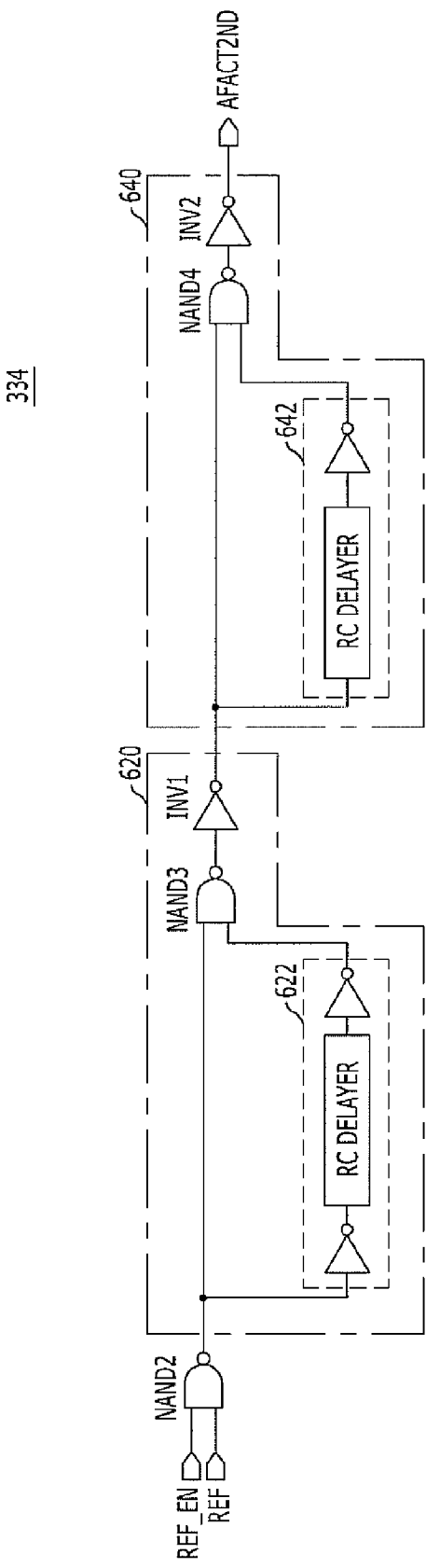
FIG. 6 is a circuit diagram of a double refresh signal generation unit shown in FIG. 3.

FIG. 6 is a circuit diagram of the double refresh signal generation unit 334 shown in FIG. 3.

Referring to FIG. 6, the double refresh signal generation unit 334 includes a second NAND gate NAND2, a first pulse generator 620, and a second pulse generator 640. The second NAND gate NAND2 performs a logic operation onto the refresh enabled duration signal REF_EN and the refresh signal REF and outputs a logic operation result. The first pulse generator 620 determines a moment when the double refresh signal AFACT2ND is enabled in response to the output of the second NAND gate NAND2. The second pulse generator 640 determines an enabled duration of the enabled double refresh signal AFACT2ND in response to the output of the first pulse generator 620.

To be specific, the first pulse generator 620 includes a delayer 622, a third NAND gate NAND3, and a first inverter INV1. The delayer 622 includes an RC delayer and an inverter and it delays an inputted signal for a predetermined time. The third NAND gate NAND3 and the first inverter INV1 perform a logic AND operation onto the input and output of the delayer 622. Therefore, the first pulse generator 620 may determine an enabling moment of the double refresh signal AFACT2ND.

The second pulse generator 640 includes a delayer 642, a fourth NAND gate NAND4, and a second inverter INV2. The delayer 642 includes an RC delayer and an inverter and it delays an inputted signal for a predetermined time. The fourth NAND gate NAND4 and the second inverter INV2 perform a logic AND operation onto the input and output of the delayer 642. Therefore, the second pulse generator 640 may determine an enabling moment of the double refresh signal AFACT2ND.

Herein, the number of inverters in the delayer 622 of the first pulse generator 620 may be an even number, and the number of inverters in the delayer 642 of the second pulse generator 640 may be an odd number. Also, the number of the inverters of the delayer 622 may be greater than the number of the inverters of the delayer 642 so that the delayer 622 may have a greater delay amount than the delayer 642.

As described above, the double refresh signal generation unit 334 senses the disabling of the refresh signal REF while the refresh enabled duration signal REF_EN is enabled, and after a time corresponding to the delay time of the delayer 622 passes from the moment when the refresh signal REF is disabled, the double refresh signal generation unit 334 generates the double refresh signal AFACT2ND that is enabled during a duration corresponding to the delay time of the delayer 642.

Figure 7A:
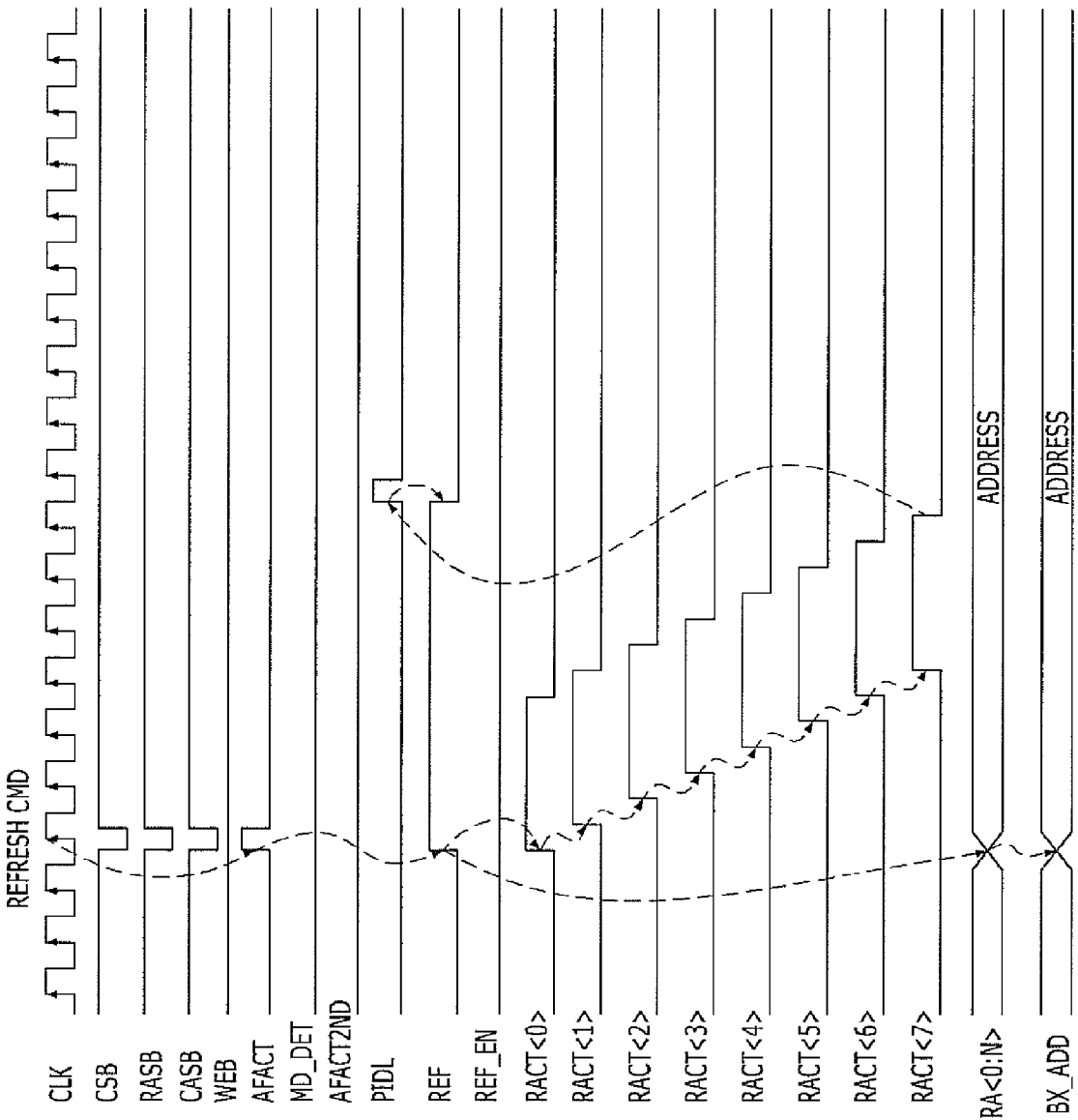
FIGS. 7A and 7B are timing diagrams describing a refresh operation controlling method of the semiconductor memory device in accordance with an exemplary embodiment of the present invention.
Figure 7B:
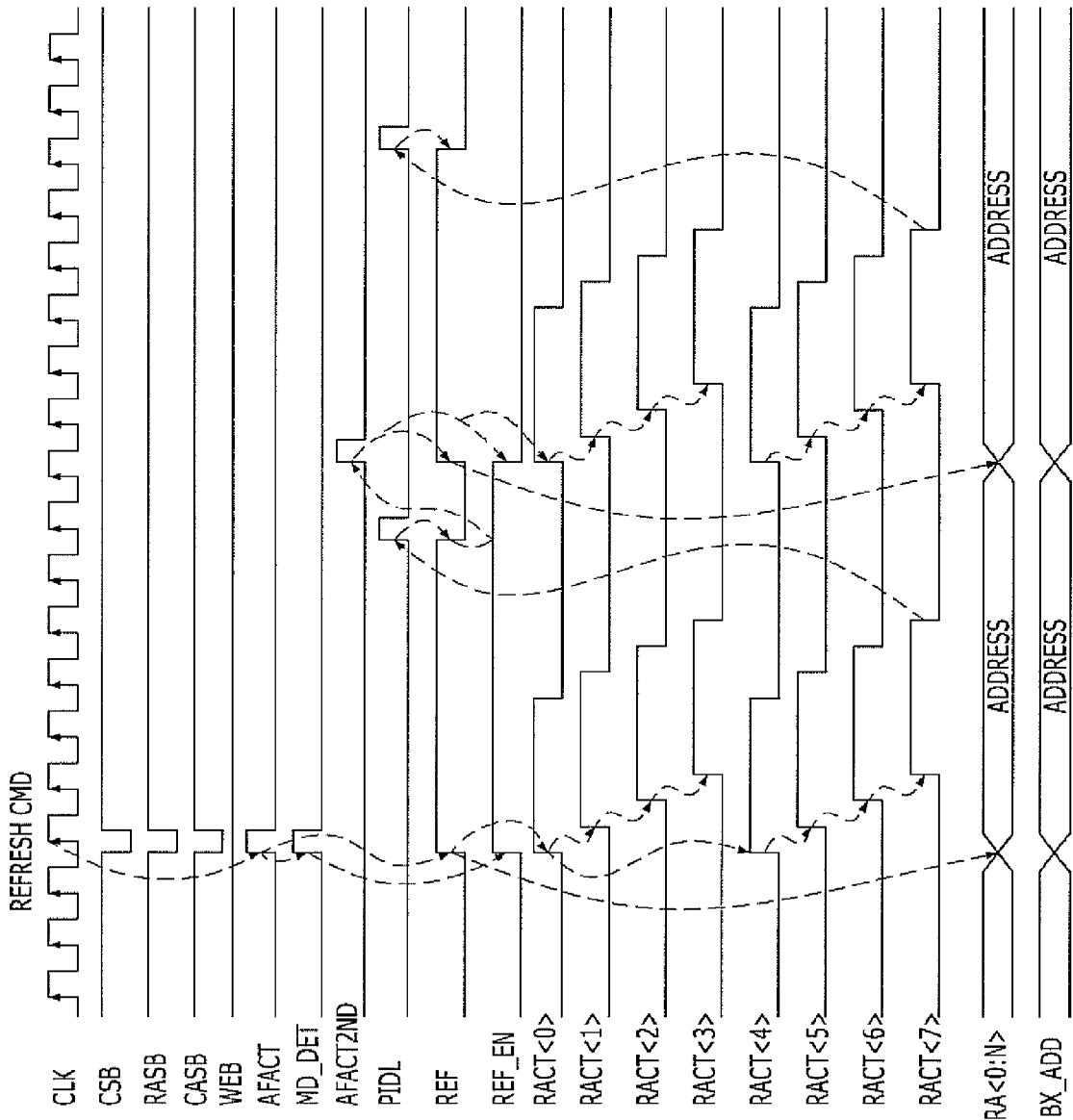

FIGS. 7A and 7B are timing diagrams describing a refresh operation controlling method of the semiconductor memory device in accordance with an exemplary embodiment of the present invention. FIG. 7A illustrates a normal refresh mode of the semiconductor memory device, and FIG. 7B illustrates a double refresh mode of the semiconductor memory device.

Hereafter, referring to FIGS. 2 to 7B, a method for controlling a refresh operation of the semiconductor memory device is described in accordance with an exemplary embodiment of the present invention.

Referring to FIG. 7A, a command generator 210 decodes external commands CSB, RASB, CASB and WEB inputted from the outside of the semiconductor memory device in response to a clock CLK and enables and outputs a refresh mode entering signal AFACT after the semiconductor memory device enters an active mode. Herein, since a mode determination signal MD_DET is not enabled, the semiconductor memory device enters a normal refresh mode.

A refresh signal generation unit 310 of a refresh controller 220 enables a refresh signal REF in response to the enabling of the refresh mode entering signal AFACT, and outputs the enabled refresh signal REF in such a manner that the signals of an active pulse signal FACT<0:7> are sequentially enabled at a predetermined delay interval. Accordingly, a bank address signal generation element 352 of a refresh termination sensing unit 350 generates a bank address RACT<0:7> that is enabled in response to the enabling of the active pulse signal FACT<0:7>, and disabled in response to the enabling of a pre-charge pulse signal PRE<0:7>.

Also, the refresh counter 230 receives the enabled refresh signal REF and outputs a refresh address RA<0:N> so that all word lines in a cell array 270 may be sequentially accessed. The row address decoder 260 generates a row address selection signal BX_ADD by decoding the refresh address RA<0:N>. The cell array 270 performs a refresh operation based on the row address selection signal BX_ADD.

Subsequently, an idle signal generation element 354 senses a moment when the last address signal of the bank address RACT<0:7> changes from enabling to disabling and enables the idle signal PIDL. As a result, the refresh signal generator 310 disables the refresh signal REF to terminate the refresh operation.

Herein, in a normal refresh mode where the mode determination signal MD_DET is disabled, the refresh enabled duration generation element 332 of the refresh controller 220 does not enable the refresh enabled duration signal REF_EN because the mode determination signal MD_DET is disabled. Therefore, since the double refresh signal AFACT2ND is not enabled during one auto refresh row cycle time tRFC, a refresh operation is performed once in the normal refresh mode.

Referring to FIG. 7B, after the semiconductor memory device enters an active mode, the command generator 210 decodes external commands CSB, RASB, CASB and WEB inputted from the outside of the semiconductor memory device in response to a clock CLK and enables and outputs the refresh mode entering signal AFACT. Herein, since the mode determination signal MD_DET is enabled, the drawing illustrates a case of a double refresh mode.

The refresh signal generation unit 310 of the refresh controller 220 enables the refresh signal REF in response to the enabling of the refresh mode entering signal AFACT, and the row address decoder 260 generates a row address selection signal BX_ADD by decoding the refresh address RA<0:N>, and the cell array 270 performs a primary refresh operation in response to the row address selection signal BX_ADD. Herein, in an exemplary embodiment of the present invention, to perform a refresh operation twice during one refresh row cycle time tRFC, the refresh operation during the double refresh mode may be performed in the form of a piled refresh operation. For example, when a core region is formed of 8 banks, the piled refresh operation is performed by pairing the banks. In other words, a bank 0 and a bank 4 are activated followed by a bank 1 and a bank 5, a bank 2 and a bank 6, and a bank 3 and a bank 7.

Also, in the double refresh mode where the mode determination signal MD_DET is enabled, the refresh enabled duration generation element 332 enables the refresh enabled duration signal REF_EN.

Subsequently, when the primary refresh operation is completed, the refresh termination sensing unit 350 senses a moment when the last address signal of the signals of the active pulse signal FACT<0:7>, which are enabled sequentially, changes from enabling to disabling and enables the idle signal PIDL. Accordingly, the refresh signal generation unit 310 disables the refresh signal REF. The double refresh signal generation element 334 senses the disabling of the refresh signal REF while the refresh enabled duration signal REF_EN is enabled and enables the double refresh signal AFACT2ND at a predetermined interval.

As the double refresh signal AFACT2ND is enabled, the refresh signal generation unit 310 enables the refresh signal REF once again. Herein, the refresh enabled duration generation element 332 of the refresh controller 220 disables the refresh enabled duration signal REF_EN in response to the double refresh signal AFACT2ND. The row address decoder 260 decodes the refresh address RA<0:N> to generate the row address selection signal BX_ADD, and the cell array 270 performs a secondary refresh operation in response to the row address selection signal BX_ADD.

Also, in response to the active pulse signal FACT<0:7> and the pre-charge pulse signal PRE<0:7> that are outputted from the refresh signal generation unit 310 of the refresh controller 220, the bank address signal generation element 352 of the refresh termination sensing unit 350 generates a bank address RACT<0:7>, and the idle signal generation element 354 enables the idle signal PIDL at a moment when the bank address RACT<0:7> is completed. As the idle signal PIDL is enabled, the refresh signal generation unit 310 disables the refresh signal REF to terminate the secondary refresh operation.

Therefore, in the double refresh mode of the present invention, the double refresh signal AFACT2ND is enabled once during an auto refresh row cycle time tRFC so that the secondary refresh operation may be performed after the primary refresh operation.

According to the technology of the present invention, which is described above, a refresh control circuit and method for a semiconductor memory device may reduce the influence of PVT variation by performing a refresh operation twice during one refresh period during a refresh mode to decrease the size of an absolute delay.

Also, the refresh control circuit and method for a semiconductor memory device may reinforce cells of a relatively short retention capacity to increase productivity by internally performing a refresh operation at a rate of 4K/32 ms, although the auto refresh operation is performed according to an external command inputted from the outside at a rate of 8K/64 ms.

Moreover, the refresh control circuit and method for a semiconductor memory device may reduce peak current required for a refresh operation while not increasing the refresh cycle time.

While the present invention has been described with respect to the specific embodiments, it will be apparent to those skilled in the art that various changes and modifications may be made without departing from the spirit and scope of the invention as defined in the following claims.

What is claimed is:

1. A refresh control circuit for a semiconductor memory device, comprising:
    a refresh controller configured to control the number of times a refresh signal is enabled during one refresh period in response to a refresh mode entering signal which indicates the start of a refresh mode, a mode determination signal having refresh mode information, and an active signal enabled in an active mode;
    a refresh counter configured to output a row address for a refresh operation by counting the refresh signal in response to the active signal; and
    a row address decoder configured to decode the row address to generate a row address selection signal for sequentially accessing word lines within a cell array.

2. The refresh control circuit of claim 1, wherein the refresh controller comprises:
    a refresh operation control unit configured to determine whether to enable a double refresh signal based on the mode determination signal when the refresh mode entering signal is enabled;
    a refresh termination sensing unit configured to count a bank address and outputting an idle signal enabled at a moment when a refresh operation is completed, when the refresh signal is enabled; and
    a refresh signal generation unit configured to enable the refresh signal, when at least one of the refresh mode entering signal and the double refresh signal is enabled, and disable the refresh signal in response to the idle signal.

3. The refresh control circuit of claim 2, wherein the refresh signal generation unit comprises:
    a logic gate configured to perform a NOR operation onto the refresh mode entering signal and the double refresh signal;

an RS latch which is set based on an output of the logic gate and reset in response to the idle signal; and a buffer configured to buffer an output of the RS latch and output a buffered output as the refresh signal.

4. The refresh control circuit of claim 2, wherein the refresh signal generation unit outputs an active pulse signal which is sequentially enabled at a predetermined delay time to enable corresponding banks, when the refresh signal is enabled.

5. The refresh control circuit of claim 4, wherein the refresh termination sensing unit comprises:

a bank address signal generation element configured to enable the bank address in response to enabling of the active pulse signal and disable the bank address in response to enabling of a precharge pulse signal for pre-charging a corresponding bank, when the active signal is enabled; and an idle signal generation element configured to enable and output the idle signal by sensing a moment when a last address signal of the bank address changes from enabling to disabling, when the refresh signal is enabled.

6. The refresh control circuit of claim 2, wherein the refresh operation control unit comprises:

a refresh enabled duration generation element configured to enable a refresh enabled duration signal in response to the mode determination signal and disable the refresh enabled duration signal in response to the double refresh signal, when the refresh mode entering signal is enabled; and a double refresh signal generation element configured to enable and output the double refresh signal based on the refresh enabled duration signal and the refresh signal.

7. The refresh control circuit of claim 6, wherein the refresh enabled duration generation element comprises:

a logic gate configured to perform a NAND operation onto the mode determination signal and the refresh mode entering signal;

an RS latch which is set based on an output of the logic gate and reset in response to the double refresh signal; and a buffer configured to buffer an output of the RS latch and output a buffered output as the refresh enabled duration signal.

8. The refresh control circuit of claim 6, wherein the double refresh signal generation element comprises:

a first logic gate configured to perform a NAND operation onto the refresh enabled duration signal and the refresh signal;

a first pulse generator configured to determine a moment when the double refresh signal is enabled in response to an output of the logic gate; and a second pulse generator configured to determine a moment when the enabled double refresh signal is enabled in response to an output of the first pulse generator.

9. The refresh control circuit of claim 8, wherein each of the first pulse generator and the second pulse generator comprises:

a delayer configured to delay an inputted signal for a predetermined time; and a second logic gate configured to perform an AND operation onto an input/output of the delayer.

10. The refresh control circuit of claim 9, wherein the delayer of the first pulse generator comprises an RC delay and an even number of inverters, and the delayer of the second pulse generator comprises an RC delay and an odd number of inverters.

11. The refresh control circuit of claim 9, wherein the delayer of the first pulse generator has a greater delay amount than the delayer of the second pulse generator.

12. The refresh control circuit of claim 1, further comprising:

a command generator configured to generate the mode determination signal, the refresh mode entering signal, and the active signal by decoding an external command in response to a clock.

13. A method for controlling a refresh operation of a semiconductor memory device, comprising:

determining the number of times a refresh signal is enabled during one refresh period in response to a refresh mode entering signal which indicates the start of a refresh mode, a mode determination signal having refresh mode information, and an active signal enabled in an active mode;

outputting a row address for a refresh operation by counting the refresh signal in response to the active signal; and generating a row address selection signal for sequentially accessing word lines within a cell array by decoding the row address.

14. The method of claim 13, wherein the determining of the number of enabling of the refresh signal comprises:

determining whether to enable a double refresh signal based on the mode determination signal when the refresh mode entering signal is enabled;

counting a bank address and outputting an idle signal enabled at a moment when a refresh operation is completed, when the refresh signal is enabled; and generating the refresh signal that is enabled when at least one of the refresh mode entering signal and the double refresh signal is enabled, and disabled in response to the idle signal.

15. The method of claim 14, wherein the generating of the refresh signal comprises:

outputting an active pulse signal which is sequentially enabled at a predetermined delay time to enable corresponding banks when the refresh signal is enabled.

16. The method of claim 14, wherein the outputting of the idle signal comprises:

generating the bank address that is enabled in response to enabling of the active pulse signal, and disabled in response to enabling of a precharge pulse signal for pre-charging a corresponding bank, when the active signal is enabled; and enabling and outputting the idle signal by sensing a moment when a last address signal of the bank address changes from enabling to disabling, when the refresh signal is enabled.

17. The method of claim 14, wherein the determining of whether to enable the double refresh signal comprises:

generating a refresh enabled duration signal that is enabled in response to the mode determination signal, and disabled in response to the double refresh signal, when the refresh mode entering signal is enabled; and enabling and outputting the double refresh signal based on the refresh enabled duration signal and the refresh signal.

18. The method of claim 13, further comprising:

generating the mode determination signal, the refresh mode entering signal, and the active signal by decoding an external command in response to a clock.

* * * * *

UNITED STATES PATENT AND TRADEMARK OFFICE
CERTIFICATE OF CORRECTION

PATENT NO. : 8,284,615 B2  
APPLICATION NO. : 12/979678  
DATED : October 9, 2012  
INVENTOR(S) : Young-Bo Shim It is certified that error appears in the above-identified patent and that said Letters Patent is hereby corrected as shown below:

Title page change Assignee item (73) of Patent as follows:

(73) Assignee: Hynix Semiconductor Inc.,
Gyeonggi-do (KR)

Signed and Sealed this
Thirteenth Day of November, 2012

David J. Kappos
*Director of the United States Patent and Trademark Office*